United States Patent
Takane et al.

(10) Patent No.: US 7,433,542 B2
(45) Date of Patent: Oct. 7, 2008

(54) METHOD FOR MEASURING LINE AND SPACE PATTERN USING SCANNING ELECTRON MICROSCOPE

(75) Inventors: Atsushi Takane, Mito (JP); Tatsuya Maeda, Hitachinaka (JP); Takashi Iizumi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 685 days.

(21) Appl. No.: 11/019,109

(22) Filed: Dec. 22, 2004

(65) Prior Publication Data

US 2005/0207673 A1   Sep. 22, 2005

(30) Foreign Application Priority Data

Dec. 26, 2003   (JP)   ............................. 2003-435519

(51) Int. Cl.
*G06K 9/36*  (2006.01)
*G06K 9/00*  (2006.01)

(52) U.S. Cl. .................................... 382/286

(58) Field of Classification Search ......... 382/141–150, 382/108, 199, 291, 286, 181, 295, 278; 356/69, 356/237.2, 625, 614, 124, 401, 515; 250/559.36, 250/307, 491.1; 348/125–128; 702/34; 438/16, 438/14
See application file for complete search history.

(56) References Cited

U.S. PATENT DOCUMENTS

| | | | |
|---|---|---|---|
| 6,258,610 B1* | 7/2001 | Blatchford et al. | 438/14 |
| 7,095,884 B2* | 8/2006 | Yamaguchi et al. | 382/145 |
| 2002/0034338 A1 | 3/2002 | Askary | |
| 2002/0149783 A1 | 10/2002 | Rotsch | |
| 2003/0021463 A1 | 1/2003 | Yamaguchi et al. | |

FOREIGN PATENT DOCUMENTS

| | | |
|---|---|---|
| JP | 57-187604 | 11/1982 |
| JP | 02-190708 | 7/1990 |
| JP | 2002-243428 A | 8/2002 |
| JP | 2003-037139 A | 2/2003 |

OTHER PUBLICATIONS

Japanese Office Action with Partial English Translation, issued in corresponding Japanese Patent Application No. JP 2003-435519, mailed on Nov. 6, 2007.

* cited by examiner

*Primary Examiner*—Sherali Ishrat
(74) *Attorney, Agent, or Firm*—McDermott Will & Emery LLP

(57) ABSTRACT

The present invention is relates to a method for measuring average line width of line and space patterns in a simplified manner and at high speed without measuring at many positions. An average line width, an average space width, and an average pitch width are calculated from peak intervals of auto-correlation values of a differentiated image of the line and space patterns or peak patterns corresponding to line edges on projection data of the differentiated image.

11 Claims, 10 Drawing Sheets

LINE WIDTH
PITCH WIDTH

ORIGINAL IMAGE
AREA WHERE CORRELATION VALUE IS CALCULATED
SHIFTED IMAGE 201 202 203 204

CORRELATION VALUE
NUMBER OF SHIFTED PIXELS (PIXELS)

ORIGINAL IMAGE

DIFFERENTIATED IMAGE

W1

METHOD FOR MEASURING LINE AND SPACE PATTERN USING SCANNING ELECTRON MICROSCOPE

BACKGROUND OF THE INVENTION

The present invention relates to a method for measurement using a scanning electron microscope, and more particularly to a method for measuring an average line width of a line and space pattern in a simplified manner and at high speed.

FIELD OF THE INVENTION

In a semiconductor manufacturing process, minute repetitive patterns are inspected by a scanning electron micro scope (SEM) (JP-A-2003-037139, JP-A-2002-243428, for example). In the recent micro-fabrication process of semiconductor, with the progress of pattern miniaturization, the edge roughness of patterns has become a major issue. With regard to the edge roughness, research has been pushed forward to inquire into the cause, and on the other hand, attempts have been made to control the line widths as a whole by an average measured length value, which includes the edge roughness.

FIG. 1 is an image of a line and space (hereafter often referred to as line & space) pattern under a scanning electron microscope (SEM). For example, in the case where an average line width, including the edge roughness, is measured by a conventional method, as indicated by numbers 1 to 6 in FIG. 1, local line widths are measured at many measuring points, and from the measured local line widths, an average value is calculated.

In the case where an average line width, including the edge roughness, of a line & space pattern is measured, to increase a better averaging effect, it is necessary to increase the number of measuring positions of local line widths; therefore, a total time for measuring the line widths is prolonged. Another problem is that since there are no quantitative indexes regarding the number of measuring positions for line widths and the optimization of the positions selected, it is hard to secure stability in accuracy.

SUMMARY OF THE INVENTION

An object of the present invention is to provide a method for measuring an average line width in a simple manner and at high speed without specifying the number of measuring points and the measuring positions when measuring an average line width of the line & space pattern.

A method for measuring a periodic line and space pattern according to the present invention comprises the steps of:
 obtaining a specimen image at a magnification, such as to include a plurality of line and space patterns, by using a scanning electron microscope;
 differentiating an obtained image;
 calculating auto-correlation values of a differentiated image; and
 figuring out at least one of an average line width, an average space width, and an average pitch width of the line and space patterns from peak intervals of auto-correlation values.

According to this method, it is possible to obtain an average line width, space width, and pitch width by a single measurement.

Another method for measuring a line and space pattern according to the present invention comprises the steps of:
 obtaining a specimen image at a magnification such as to include a plurality of line and space patterns by using a scanning electron microscope;
 differentiating an obtained image;
 obtaining projection data by projecting all pixel values of the differentiated image to a horizontal or vertical axis;
 calculating auto-correlation values of the projection data;
 figuring out at least one of an average line width, an average space width, and an average pitch width of the line and space patterns from peak intervals of the auto-correlation values.

According to this method, the amount of processing data of auto-correlation can be reduced, and the processing time can be shortened.

Yet another method for measuring a line and space pattern according to the present invention comprises the steps of:
 obtaining a specimen image at a magnification such as to include a plurality of line and space patterns by using an electron microscope;
 differentiating an obtained image;
 obtaining projection data by projecting all pixel values of a differentiated image to a horizontal or vertical axis;
 obtaining peak intervals corresponding to edges of line and space patterns on the projection data;
 calculating at least one of an average line width, an average space width, and an average pitch width of the line and space pattern from an average of peak intervals. According to this method, the auto-correlation process is not required, the complicated process can be omitted, and the processing time can be shortened.

The direction of moving an image when obtaining an auto-correlation value is in parallel with the periodic direction of the line and space pattern, and the projection direction for obtaining projection data is in a direction perpendicular to the periodic direction of the line and space pattern.

According to the present invention, an average line width, an average space width, and an average pitch width are calculated from the whole area of the obtained image, so that the average line width can be measured in a simplified manner and at high speed without measuring at many positions.

Other objects, features and advantages of the present invention will become more apparent from the following description of embodiments of the present invention with reference to the accompanying drawings.

DESCRIPTION OF THE EMBODIMENTS

Embodiments of the present invention will be described with reference to the accompanying drawings.

Figure 3:
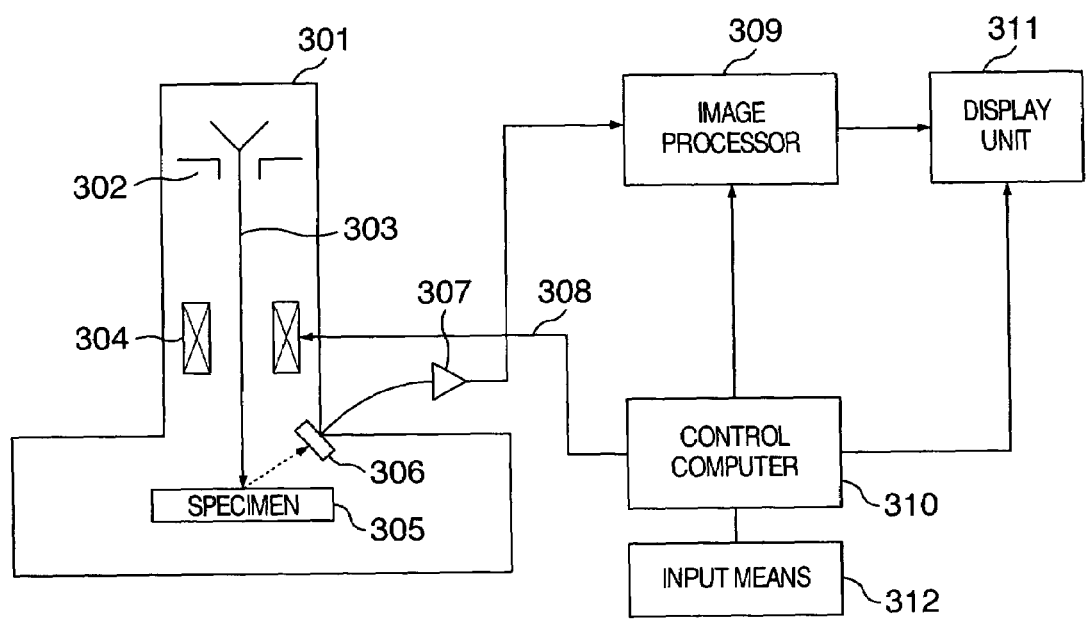
FIG. 3 is a schematic block diagram showing a structure of a scanning electron microscope.

FIG. 3 is a schematic block diagram of a scanning electron microscope used in the measuring methods of the present invention. A beam of electrons 303 emitted from an electron gun 302 mounted in an optical unit 301 is converged by an electron lens not shown and irradiated to a specimen 305. The intensity of secondary electrons or reflected electrons generated from the surface of the specimen by electron-beam irradiation is detected by an electron detector 306, and a detection signal is amplified by an amplifier 307. A deflector 304 controlled by a control signal 308 from a control computer 310 causes the electron beam 303 to raster-scan the surface of the specimen. A signal output from the amplifier 307 is converted from analog into digital form in an image processor 309, thereby generating digital image data. The image data is displayed on a display unit 311. The image processor 309 includes an image memory for storing digital image data, an image processing circuit for various image processes, and a display control circuit, to control display. Input means such as a keyboard and a mouse are connected to the control computer 310. A scanning electron microscope such as this is used when measuring line widths of a minute pattern delineated on a wafer in the manufacture of semiconductor devices.

Figure 10A:
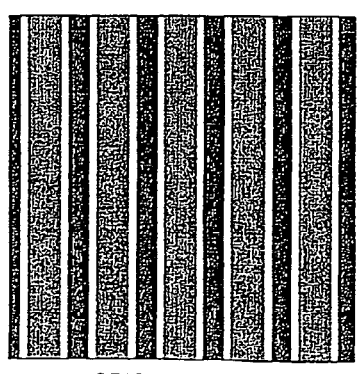
FIGS. 10A and 10B are diagrams for explaining a differentiated image used in the present invention.
Figure 10B:
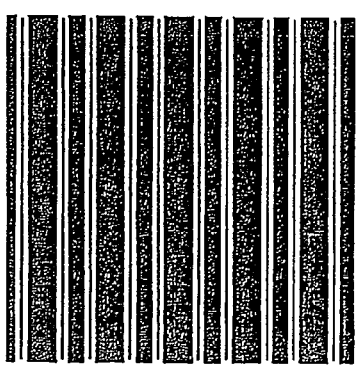

FIGS. 10A and 10B are diagrams for explaining a differentiated image used in the present invention. FIG. 10A is an original line and space image obtained by the scanning electron microscope shown in FIG. 3. FIG. 10B is an image formed by subjecting the line and space image to a differentiation process. Pixel values of high luminance occur at change points of luminance in a differentiated image and at edge portions along the boundaries between lines and spaces in an SEM image. The differentiation process on images can be executed by using a differentiation filter, such as a Sobel filter used in ordinary image processing.

Figure 1:
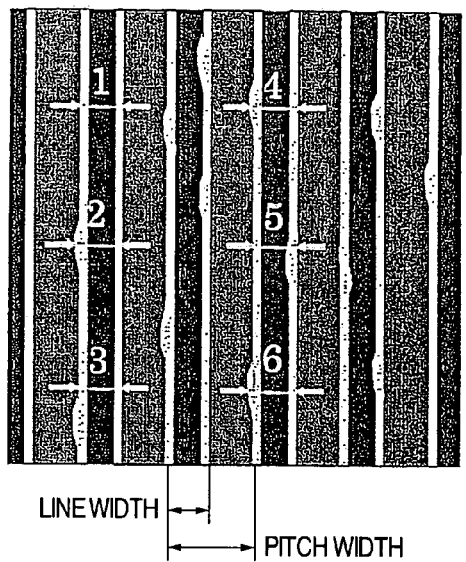
FIG. 1 is a diagram showing an example of a line and space pattern image.
Figure 2A:
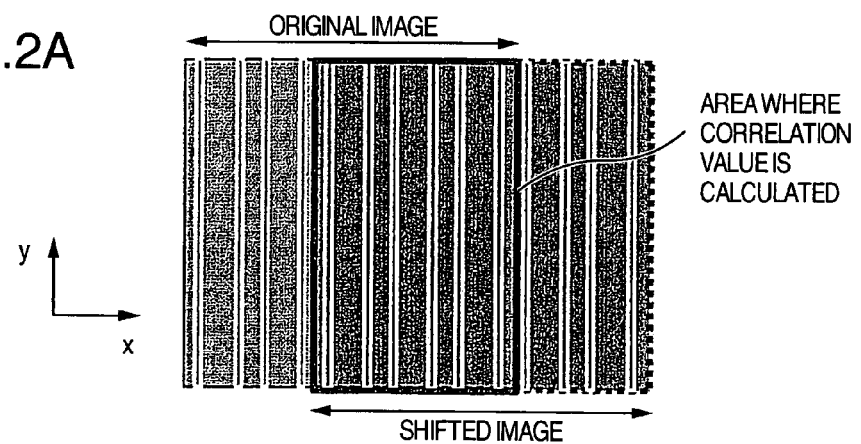
FIGS. 2A and 2B show an outline of calculation of auto-correlation values of a differentiated image and a graph of auto-correlation values obtained.
Figure 2B:
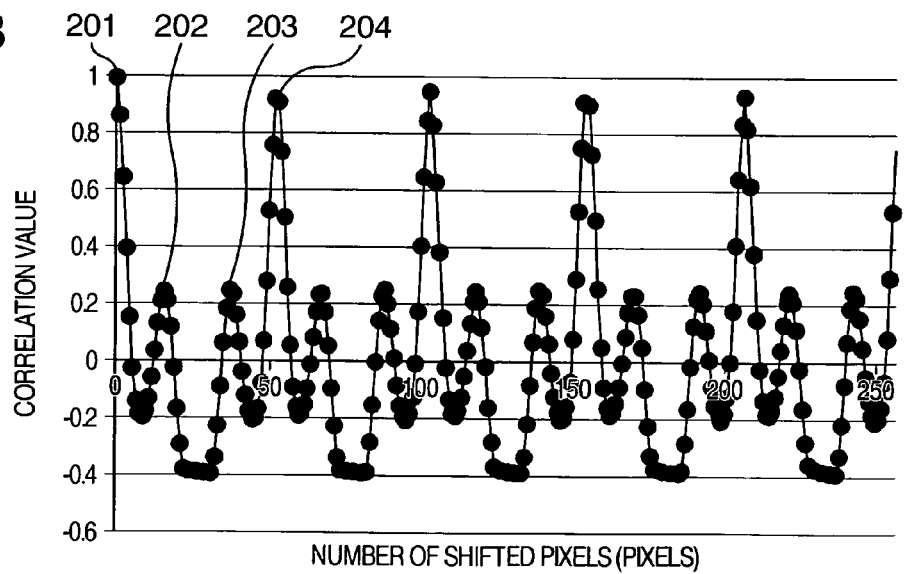

FIGS. 2A and 2B show an outline of calculation of auto-correlation values of a differentiated line & space image and a graph of auto-correlation values obtained. The auto-correlation values are obtained as normalized correlation values of the original image and the identical image shifted a certain distance in one direction. FIG. 2A is an example that because the lines and the spaces show periodicity in the X-direction, an auto-correlation value is calculated between the original image and the identical image shifted in the X-direction (periodic direction). Since the area indicated by a thick frame indicates the overlapping portions, a normalized correlation value is calculated for this area. When the number of shifted pixels is zero, correlation is between the original image and a copy of itself, the correlation value is 1. As the amount of shift increases, the correlation value decreases. If the image has periodic patterns, peaks occur at each repetition period of the pattern. Because, in auto-correlation, a correlation value is obtained for the whole overlapping area, in the positions where peaks occur, the degree of coincidence of all the lines and spaces included in the overlapping portions is reflected. In other words, peaks occur at the average repeating positions of the line widths of the line and space patterns included. By obtaining the intervals of the peaks, it is possible to calculate an average line width, space width and pitch width. In FIG. 2B, an interval between the first peak 201 and the fourth peak 204 is equal to a pitch width, and an interval between the first peak 201 and the second peak 202 is equal to the line width.

Figure 4:
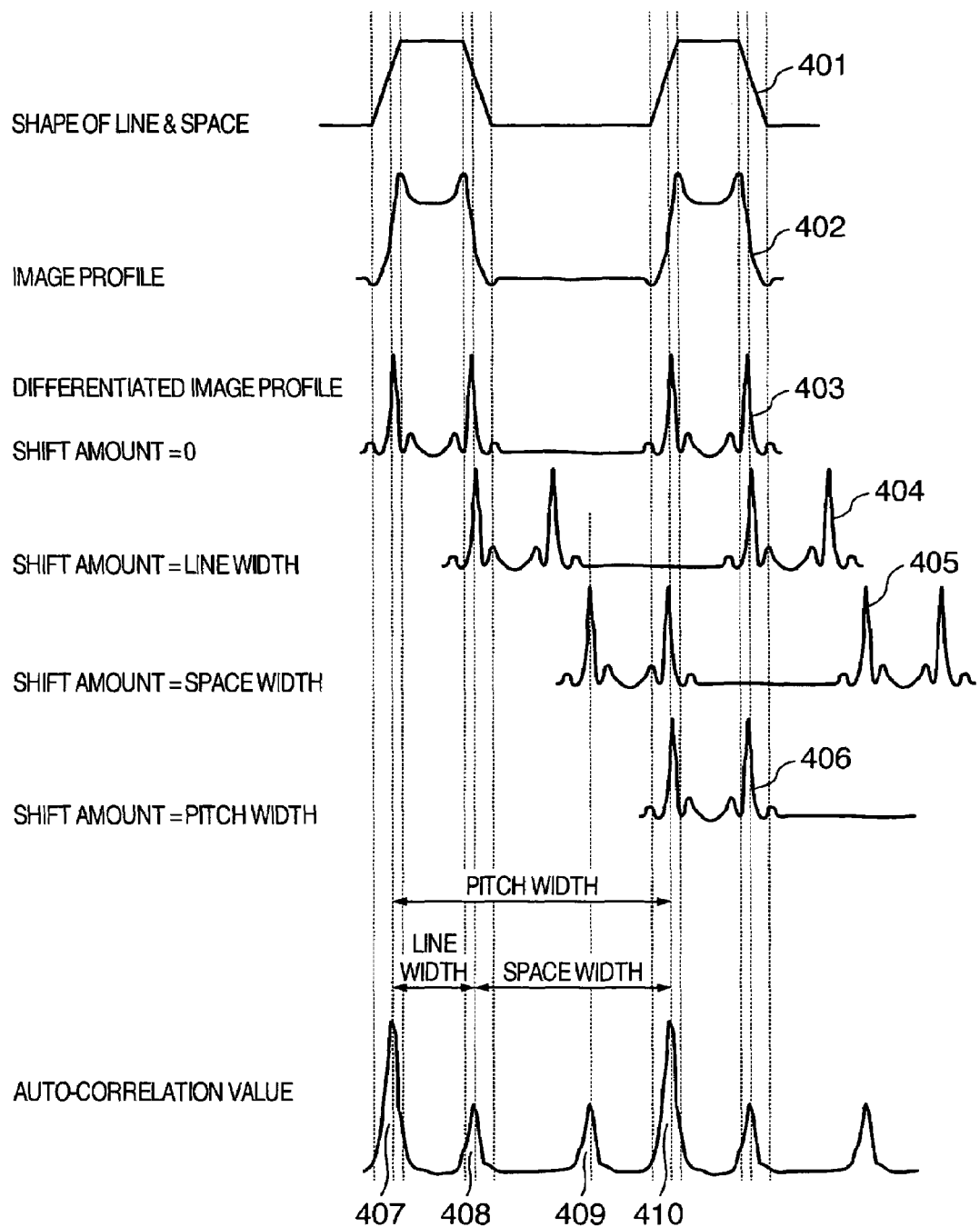
FIG. 4 is a diagram explaining changes in the auto-correlation values in FIG. 2B from signal profiles.

FIG. 4 is a diagram for explaining changes in the auto-correlation values in FIG. 2B from signal profiles. Reference numeral 401 indicates the shape of a line and space pattern, 402 indicates a signal strength profile of an SEM image, and 403 indicates a signal strength profile of a differentiated image. In the differentiated image profile 403, the signal strength reaches peaks at the left and right edges of each line. In measuring auto-correlation, first of all, when there are no pixels shifted, a peak 407 is formed. In this case, the correlation value is 1. Next, when the shift amount at 404 becomes equal to the line width, the peak of the left edge laps over the peak of the right edge, with the result that a peak 408 is formed. Furthermore, when the shift amount at 405 becomes equal to the space width, the peak of the right edge laps over the peak of the left edge of the next period, and as a result, a peak 409 is formed. When the shift pixels run up to an amount for one period at 406, a peak 410 is formed. Where the shift amounts reach lengths equal to repetition periods as at 407 and 410, the size of peaks becomes large, and the peaks that occur at the edges or in the space width as at 408 and 409 are small. The interval between 407 and 408 is a line width, and the interval between 408 and 410 is a space width, and the interval between 407 and 410 is a pitch width.

Figure 5:
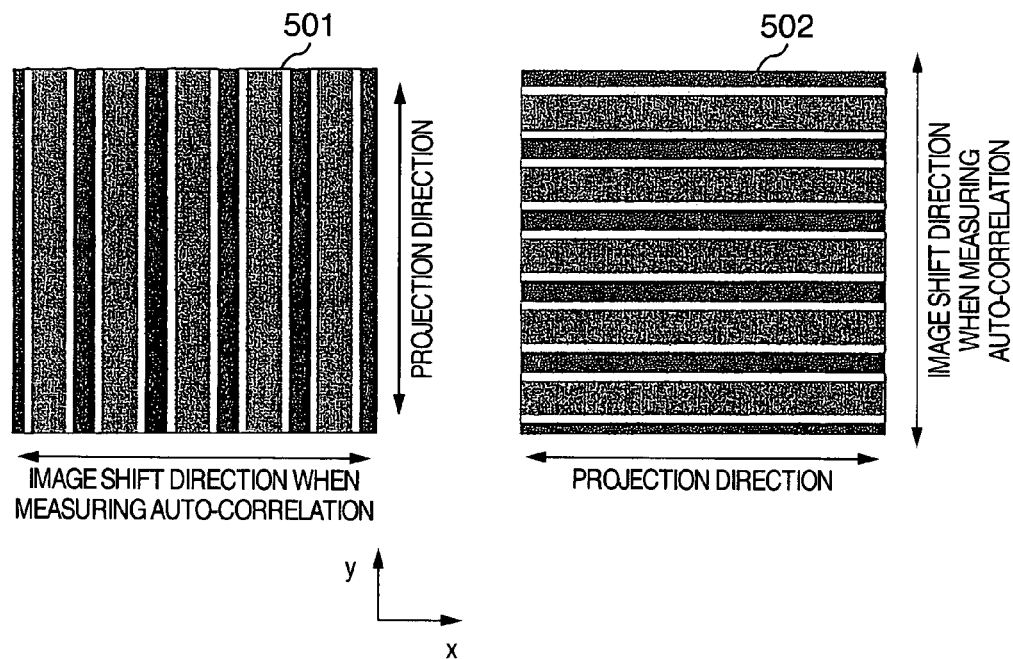
FIG. 5 is a diagram explaining a projection direction to obtain projection data and a direction of shifting an image when measuring auto-correlation.

FIG. 5 is a diagram explaining a method for obtaining a projection direction to take a projection and a direction of shifting an image when measuring auto-correlation. For a line pattern 501 in the vertical direction (y-axis direction), the direction of shifting the image when measuring auto-correlation is in the horizontal direction (x-axis direction) and the projection direction to take a projection is in the vertical direction (y-axis direction). For a line pattern 502 in the horizontal direction (x-axis direction), the direction of shifting the image when measuring auto-correlation is in the vertical direction (y-axis direction) and the projection direction to take a projection is in the horizontal direction (x-axis direction). By setting the direction of moving an image when measuring auto-correlation to be in the periodic direction of the line and space pattern, information about the line width, space width and pitch width is correctly reflected in auto-correlation values. Also, by setting the projection direction for obtaining projection data to be in a direction perpendicular to the periodic direction of the line & space pattern, information about the line width, space width and pitch width is correctly reflected in projection data.

Figure 6:
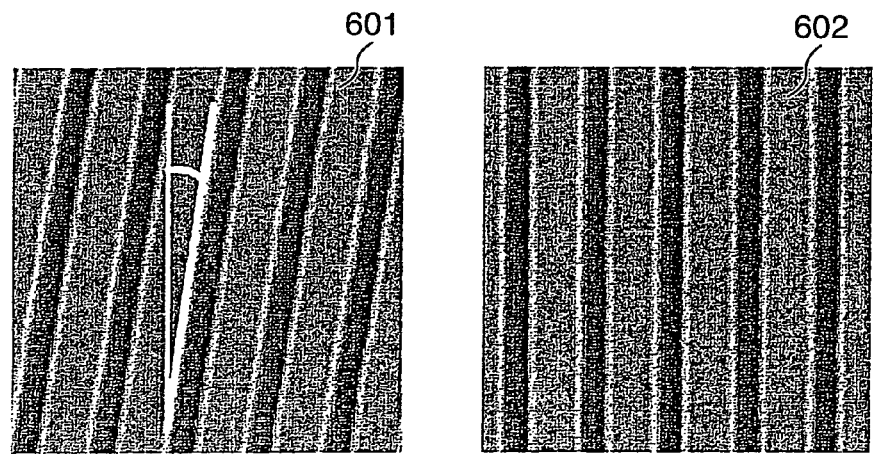
FIG. 6 is a diagram explaining a correction method for when the line & space pattern is tilted.

FIG. 6 is a diagram explaining a correction method when the line & space pattern is tilted from the x-axis direction or the y-axis direction. By the method described with reference to FIG. 5, it is possible to obtain a direction of projecting the line and space pattern and a direction of shifting an image when measuring auto-correlation; however, in the case where the line and space pattern is tilted, if the line intervals and pitch intervals are measured as they are by the method of the present invention, the measured intervals may be larger than actual intervals by the amount of tilt or the pixel values of the lines and spaces may overlap when they are projected, so that correct values cannot be obtained. Therefore, by obtaining an angle formed by the direction of the line & space pattern with the x-axis or the y-axis as shown in FIG. 6, and by rotating the image by the tilt angle as shown at 602 by using image processing, such as affine transformation, the projection direction or the direction of shifting the image when measuring auto-correlation can be made perpendicular to or parallel with the x-axis or the y-axis. In this manner, by figuring out an angle between the line & space pattern and the horizontal axis (x-axis) or the vertical axis (y-axis) and rotating the image so that the line or space pattern may be perpendicular to or parallel with the horizontal axis (x-axis) or the vertical axis (y-axis), accurate auto-correlation values and projection data can be obtained even if the line & space pattern was tilted.

Figure 7:
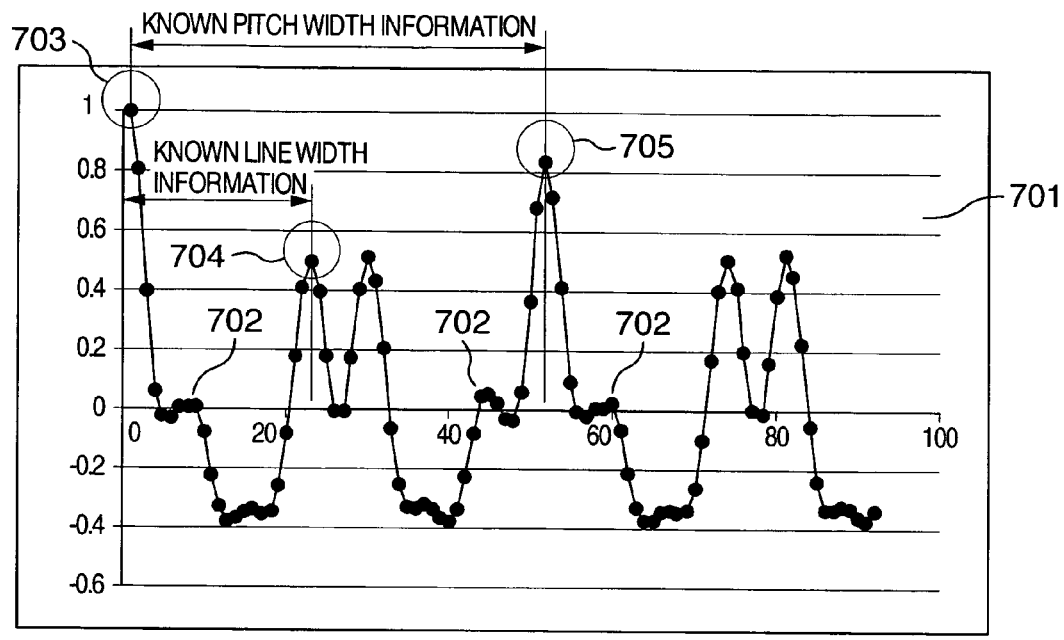
FIG. 7 is a diagram showing a method for selecting signal peaks necessary for calculating an average line width from auto-correlation values or projection data.

FIG. 7 is a diagram showing a method for selecting signal peaks necessary for calculating an average line width from auto-correlation values or projection data. There may be occasionally signal peaks unnecessary for calculation of line widths as shown at 702 on auto-correlation values or projection data 701. In this case, if there is known information about a line width, a space width and a pitch width as design data or the like, it is possible to selectively extract only necessary peaks close to known line width information such as at 703, 704 and 705. As known information, not only design data but also values previously obtained by equipment and methods other than those in the present invention may be used. In the case where an average line width is calculated from a plurality of signal peaks that appear on auto-correlation values or projection data as described above, by selecting necessary signal peaks for the above-mentioned calculation by using information about known coordinates, peak intervals, and so on obtained by a different method, it becomes possible to performed correct measurements with less chances for false peaks by noise to be detected erroneously.

Figure 8A:
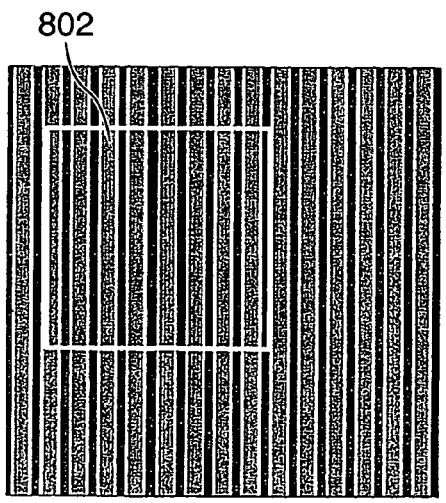
FIGS. 8A and 8B are diagrams for explaining a method for calculating an average line width in each area on an image.
Figure 8B:
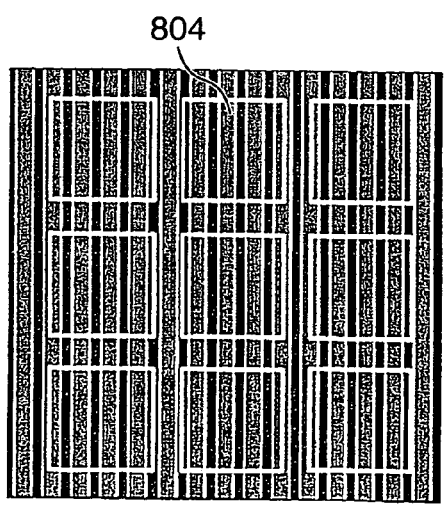

FIGS. 8A and 8B are diagrams explaining a method for setting processing areas on an image and calculating an average line width in each area. FIG. 8A shows an example where an optional measuring area 802 is specified and an average line width in this specified area is obtained. In the manner described, by optionally setting an area where measurements are to be performed and calculating an average line width in that area, it becomes possible to obtain the average line width, an average space width, and an average pitch width in the area where they are to be measured. FIG. 8B shows an example in which a plurality of areas 804 are specified and an average line width is calculated in each area. In this case, the average and variance among the respective areas can be calculated, and also a dispersion on the image of the average line widths, the average space widths, and the average pitch widths among the areas can be measured.

Figure 9A:
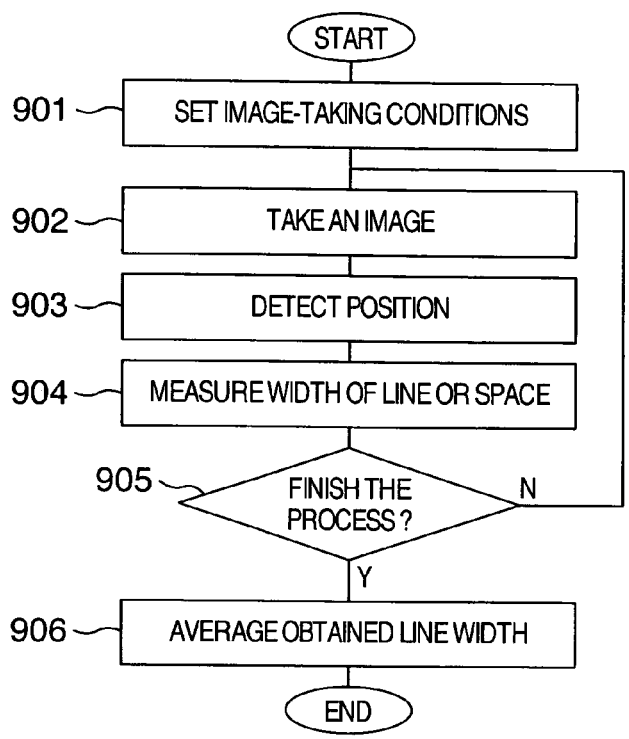
FIGS. 9A and 9B show the process flows when the line widths are measured on a line and space image.
Figure 9B:
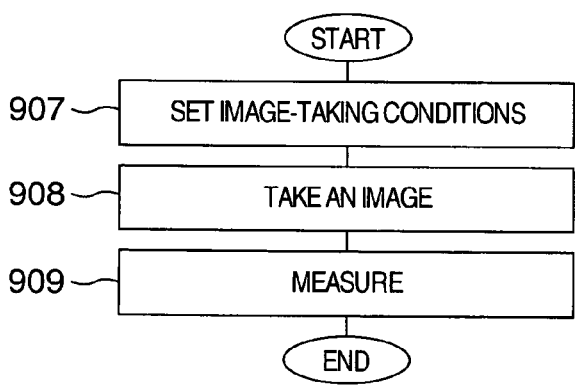

FIGS. 9A and 9B show the process flows when the line widths are measured on a line and space image. FIG. 9A shows a conventional method and FIG. 9B shows a method according to the present invention. In the conventional method shown in FIG. 9A, the image-taking conditions of electron microscopic equipment used are set (901). The image-taking conditions include a magnification, image-taking position, image-taking range, accelerating voltage, etc. Under on those conditions, a specimen wafer is irradiated by a beam of electrons, and an image is taken and stored (902). From a taken image, the position of a line width to be measured is detected (903). In the detection of the position of the line width measured, from projection data of a taken image, edge positions of a line or a space are detected and the coordinates are output. If edge positions of a plurality of lines or spaces are output, the edge positions closest to the center of the image are output. Then, based on obtained edge coordinates of a line or a space, a width of the line or the space is measured (904). If, because of a large edge roughness, it is necessary to measure line widths at several positions to obtain an average value, a decision is made whether to finish the process (905), and when a decision is made to finish the process, steps 901 to 904 are repeated a necessary number of times. After measurement is performed a plurality of times, an average of measured values is finally calculated (906).

In contrast, according to the method of the present invention, as shown in FIG. 9B, in the condition setting process, a magnification, an image-taking position, and an image-taking range are set in such a manner as to include a plurality of line & spaces to be measured in a taken image (907). Under those conditions, specimen images are taken and stored (908). Since an average line width is calculated at last from the whole of the obtained screen image in step 909, it is unnecessary to detect the positions of lines or spaces to be measured in step 903 as shown in FIG. 9A, and it is also unnecessary to repeat picture-taking to calculate average values in steps 905 and 906. According to the present invention, as described above, average values of an equal plurality each of line widths and space widths can be obtained. In addition, a position of one line or one space is not specified but a wide area is specified, which simplifies operation.

Figure 11:
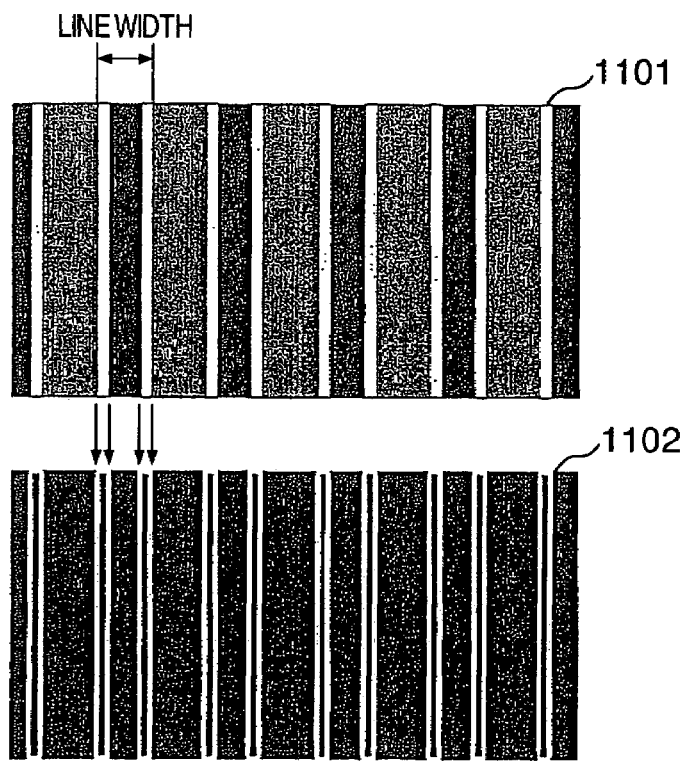
FIG. 11 is a diagram explaining a method for calculating an average line width and an average pitch width from peak intervals on projection data of a differentiated image.
Figure 11:
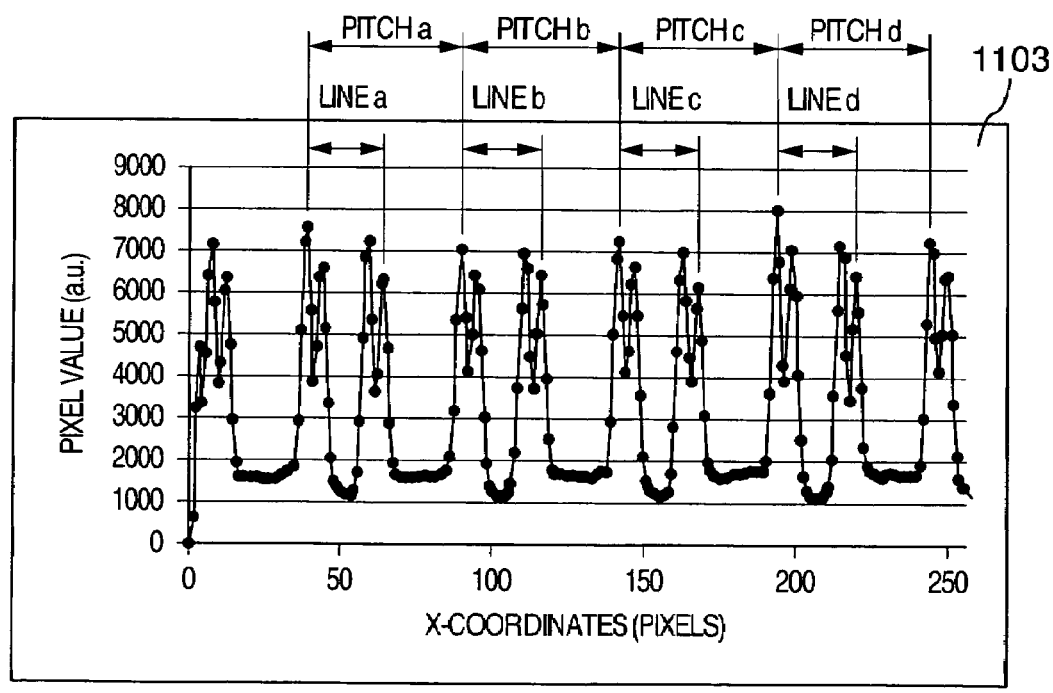

FIG. 11 is a diagram explaining a method for calculating an average line width and an average pitch width from peak intervals on projection data of a differentiated image. An original image 1101 is put to a differentiation process to obtain a differentiated image 1102. Number 1103 denotes projection data along the vertical direction (y-axis) of the differentiated image 1102. By obtaining peak intervals on projection data 1103 that correspond to the respective line widths of the original image 1101 and also by averaging them, an average line width is obtained. In the example of FIG. 11, an average line width is obtained by the following equation.

Average line width=(line $a$+line $b$+line $c$+line $d$)/4

An average space width and an average pitch width can be obtained in a similar way.

Figure 12:
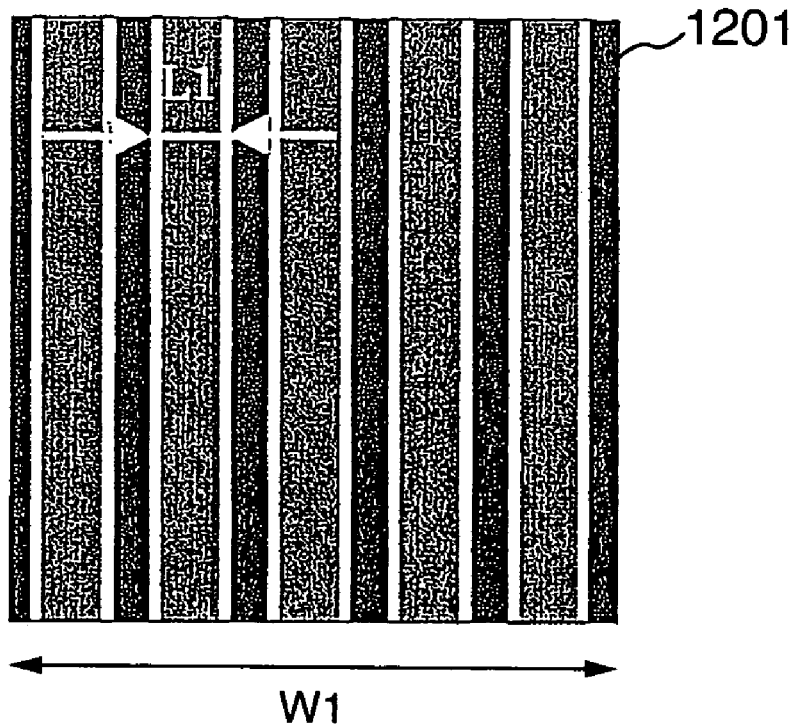
FIG. 12 is a diagram explaining a method for controlling the magnification when obtaining an image.
Figure 12:
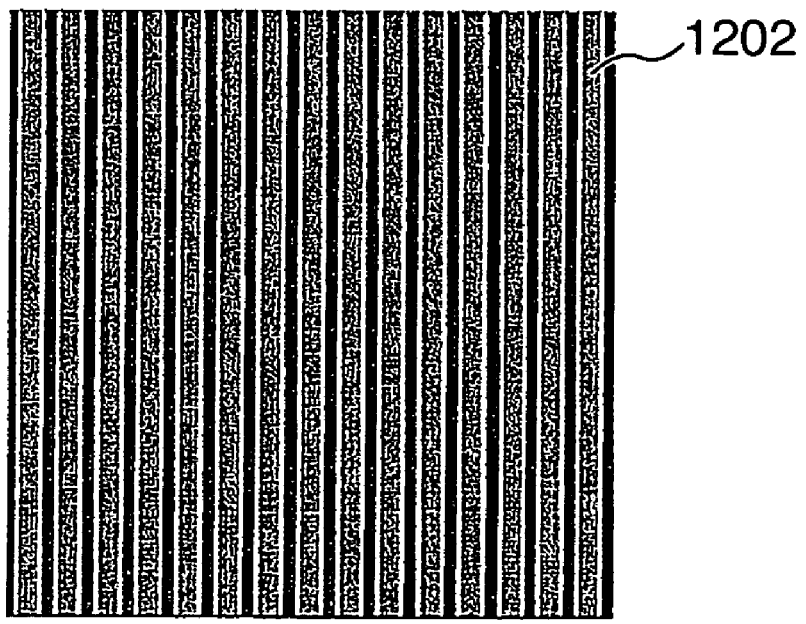

FIG. 12 is a diagram explaining a method for controlling the magnification when obtaining an image. When measuring an average line width using the whole screen image as in the present invention, it is necessary to include more than a certain ratio of the lines in an image to raise an averaging effect in measurement. The number of lines included in an image can be obtained by a ratio of W1 to L1, namely, W1/L1. Therefore, if the number of lines included in an image (W1/L1) is smaller than a predetermined value, the magnification for obtaining an image may be reduced to increase the number of lines included in an image and then picture-taking may be carried out. For example, if a minimum number of lines included in an image is denoted by Th and the magnification for taking an image 1201 is denoted by Ma, supposing W1/L1<Th, a magnification Mb is set such that Mb=(W1/L1)(Ma/Th), an image 1202 is obtained. When the number of lines or spaces included in an image is smaller than a predetermined as mentioned above, by obtaining an image by varying the magnification of the electronic optical system so that the image may be of a size that meets the above condition, the process can be carried out without decreasing the averaging effect.

Figure 13:
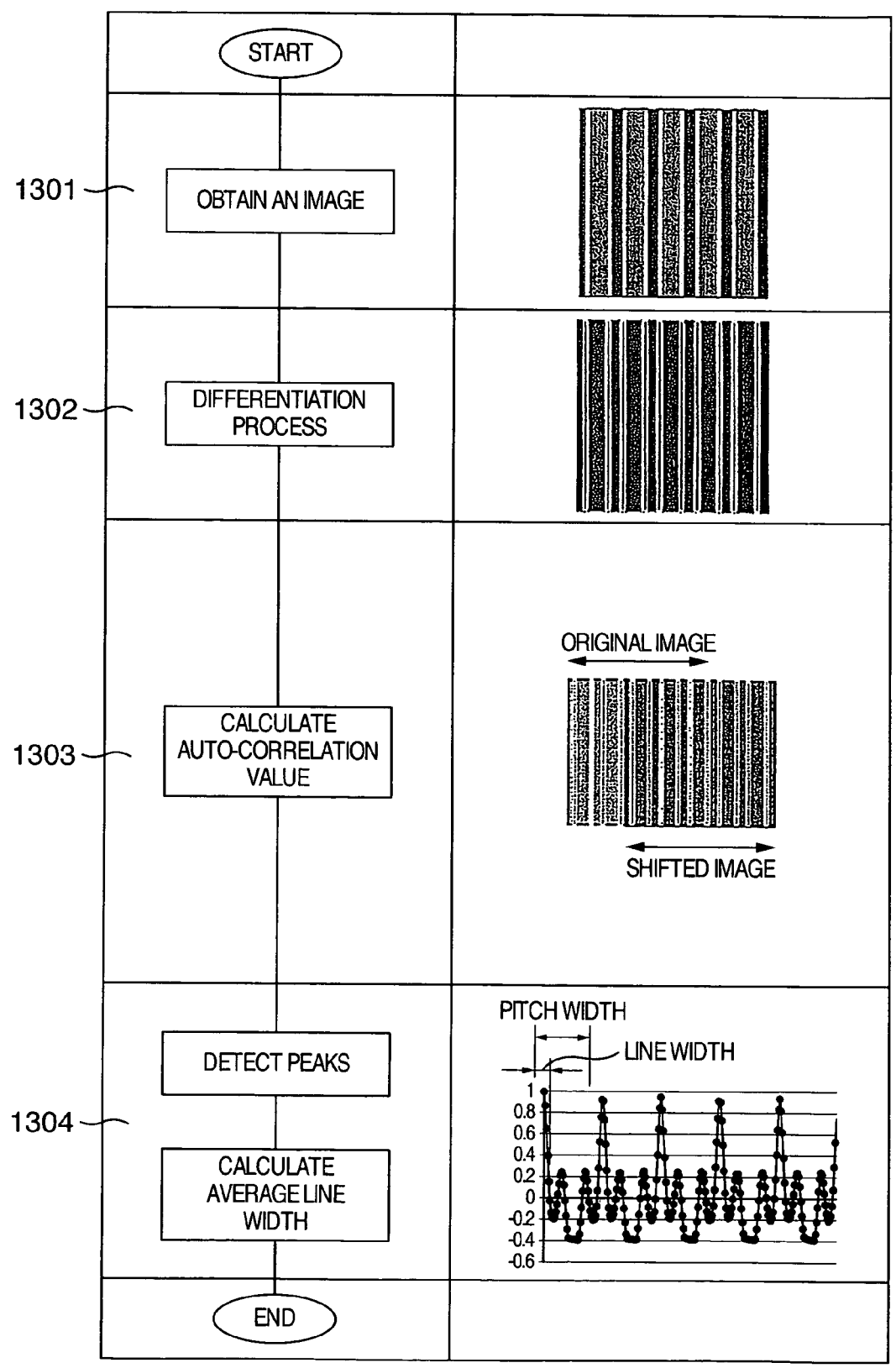
FIG. 13 is a process flow for obtaining auto-correlation from a differentiated image in measurement of an average line width in the present invention.

FIG. 13 is a process flow for obtaining auto-correlation from a differentiated image in measurement of an average line width in the present invention. In step 1302, an image obtained in a previous step 1301 is subjected to a differentiation process, which has been described with reference to FIGS. 10A and 10B. Then, in step 1303, an auto-correlation value, mentioned in the description referring to FIG. 2A, is calculated, and in step 1304, peaks are detected, and an average line width, an average space width, and an average pitch width are obtained from detected peaks.

Figure 14:
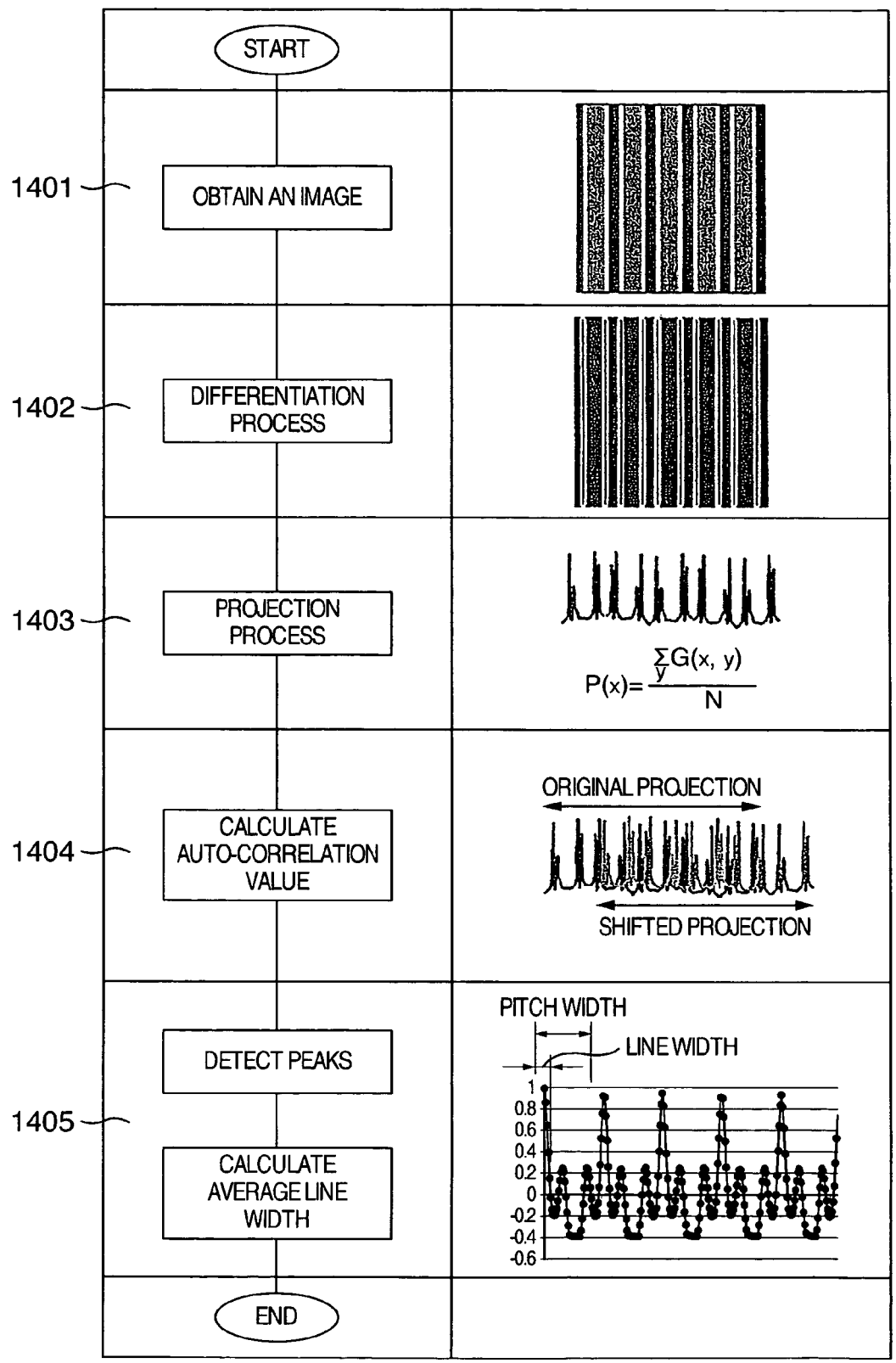
FIG. 14 is a process flow when obtaining auto-correlation from the projection of a differentiated image in measurement of average line widths according to the present invention.

FIG. 14 is a process flow when obtaining auto-correlation from the projection of a differentiated image in the measurement of average line widths according to the present invention. In step 1402, an image obtained in step 1401 is subjected to a differentiation process, which has been mentioned in the description referring to FIG. 10. Then, in step 1403, a projection is calculated. A projection can be obtained by the following equation (1).

$$P(x) = \frac{\sum_{y=0}^{n-1} G(x, y)}{N} \quad (1)$$

where G(x, y) is a pixel value of an image and N is the number of pixels in a projection direction, that is, in the x-axis or the y-axis. The projection direction is decided by the method described referring to FIG. 5. In step 1404, an auto-correlation value of the projection is calculated, and in step 1405, peaks are detected, and an average line width, an average space width, and an average pitch width are obtained from detected peaks. Calculation of auto-correlation values by the projection simplifies calculation and increases the process speed.

Although the foregoing has been a description of preferred embodiments, the present invention is not limited to those embodiments, and it will be apparent to those skilled in the art that numerous variations and modifications can be made in the present invention without departing from the spirit of the present invention and the scope of claims appended herewith.

The invention claimed is:

1. A method for measuring a periodic line and space pattern formed on a specimen, comprising the steps of:
   obtaining a specimen image at a magnification such as to include a plurality of line and space patterns by using a scanning electron microscope;
   differentiating an obtained image;
   calculating auto-correlation values of a differentiated image;
   figuring out at least one value of an average line width, an average space width, and an average pitch width of the above-mentioned line and space patterns from peak intervals of the auto-correlation values; and
   displaying the figured out at least one value, or storing the figured out at least one value, or sending the figured out at least one value, or using the figured out at least one value to design a line and space pattern, or using the figured out at least one value to fabricate a line and space pattern.

2. A method for measuring a periodic line and space pattern formed on a specimen, comprising the steps of:
   obtaining a specimen image at a magnification such as to include a plurality of line and space patterns by using a scanning electron microscope;
   differentiating an obtained image; obtaining projection data by projecting all pixel values of the above-mentioned differentiated image on a horizontal or vertical axis;
   calculating auto-correlation values of the projection data;
   figuring out at least one value of an average line width, an average space width, and an average pitch width of the above-mentioned line and space pattern from peak intervals of the auto-correlation values; and
   displaying the figured out at least one value, or storing the figured out at least one value, or sending the figured out at least one value, or using the figured out at least one value to design a line and space pattern, or using the figured out at least one value to fabricate a line and space pattern.

3. A method for measuring a periodic line and space pattern formed on a specimen, comprising the steps of:
   obtaining a specimen image at a magnification such as to include a plurality of line and space patterns by using a scanning electron microscope;
   differentiating an obtained image; obtaining projection data by projecting all pixel values of the above-mentioned differentiated image on a horizontal or vertical axis;
   obtaining peak intervals corresponding to edges of the line and space patterns on the projection data;
   figuring out at least one value of an average line width, an average space width, and an average pitch width of the above-mentioned line and space patterns from an average of the peak intervals; and
   displaying the figured out at least one value, or storing the figured out at least one value, or sending the figured out at least one value, or using the figured out at least one value to design a line and space pattern, or using the figured out at least one value to fabricate a line and space pattern.

4. The measuring method according to claim 1, wherein a direction of moving the image when obtaining the above-mentioned auto-correlation values is in parallel with a periodic direction of the line and space patterns.

5. The measuring method according to claim 2, wherein a projection direction of obtaining the above-mentioned projection data is a direction perpendicular to the periodic direction of the line and space patterns.

6. The measuring method according to claim 1, further comprising the steps of calculating an angle between the line and space patterns and the horizontal axis or the vertical axis and rotating the image so that the line and space patterns are perpendicular to or parallel with the horizontal axis or the vertical axis.

7. The measuring method according to claim 1, further comprising the step of selecting peaks necessary for the above-mentioned figuring out by using known information about the line and space patterns.

8. The measuring method according to claim 1, further comprising the step of setting an area to be measured on the specimen image to figure out at least one of an average line width, an average space width, and an average pitch width of the line and space patterns in the above-mentioned area.

9. The measuring method according to claim 1, further comprising the step of setting a plurality of areas to be measured on the specimen image to figure out at least one of an average line width, an average space width, and an average pitch width of the line and space patterns in each area and figure out an average or variance among those areas.

10. The measuring method according to claim 1, further comprising the step of specifying an area including not less than a predetermined number of lines or spaces as measuring objects as an area where specimen images are obtained.

11. The measuring method according to claim 10, further comprising the step of obtaining specimen images by changing the magnification so that the number of lines or spaces may be larger than the above-mentioned predetermined number when the number of lines or spaces when the number of lines or spaces included in the specimen images is smaller than the above-mentioned predetermined number.

* * * * *